(12) United States Patent
Kim et al.

(10) Patent No.: US 7,951,302 B2
(45) Date of Patent: May 31, 2011

(54) METHOD FOR FORMING BUMP OF PROBE CARD

(75) Inventors: Bong Hwan Kim, Seoul (KR); Jong Bok Kim, Goyang-si (KR)

(73) Assignee: Will Technology Co., Ltd, Suwon-si (KR)

( * ) Notice: Subject to any disclaimer, the term of this patent is extended or adjusted under 35 U.S.C. 154(b) by 910 days.

(21) Appl. No.: 11/832,770

(22) Filed: Aug. 2, 2007

(65) Prior Publication Data

US 2008/0047927 A1    Feb. 28, 2008

(30) Foreign Application Priority Data

Aug. 23, 2006  (KR) .......................... 10-2006-0079873

(51) Int. Cl.
*H01B 13/00*  (2006.01)

(52) U.S. Cl. .............. 216/17; 216/20; 216/37; 257/208; 257/210; 257/691; 257/736; 257/786

(58) Field of Classification Search ................... 216/20, 216/37; 257/208, 210, 691, 736, 786
See application file for complete search history.

(56) References Cited

U.S. PATENT DOCUMENTS

| | | | | |
|---|---|---|---|---|
| 5,134,365 A * | 7/1992 | Okubo et al. | ................. | 324/754 |
| 6,127,729 A * | 10/2000 | Fukuda | ......................... | 257/736 |
| 6,215,321 B1 * | 4/2001 | Nakata | ......................... | 324/754 |
| 7,235,413 B2 * | 6/2007 | Hasebe et al. | .................. | 438/15 |

OTHER PUBLICATIONS

Cho Younghak, et al. Sensor and Actuators, A 114 (2004) pp. 327-331.*

* cited by examiner

*Primary Examiner* — Nadine G Norton
*Assistant Examiner* — Maki A Angadi
(74) *Attorney, Agent, or Firm* — Sughrue Mion, PLLC

(57) ABSTRACT

A method for forming a bump of a probe card is disclosed. In accordance with the method, a bump having a high aspect ratio for supporting a probe tip and a probe beam is formed using a semiconductor substrate as a mold eliminating a need for a photoresist film.

13 Claims, 7 Drawing Sheets

METHOD FOR FORMING BUMP OF PROBE CARD

BACKGROUND OF THE INVENTION

1. Field of the Invention

The present invention relates to a method for forming a bump of a probe card, and more particularly to a method for forming a bump of a probe card wherein a bump having a high aspect ratio for supporting a probe tip and a probe beam is formed using a semiconductor substrate as a mold without using a photoresist film.

2. Description of the Related Art

A probe card is used to carry out a wafer level test. A plurality of cantilever structures are formed on the probe card wherein each of the cantilever structures includes a bump, a cantilever beam and a probe tip. The cantilever beam, which provides an elasticity, is a main body of the cantilever structure, and the probe tip is a portion that contacts a pad on a wafer. The bump is a support of the cantilever beam which allows the probe tip attached to an end portion of the cantilever beam to be capable of an elastic contact.

As an integration density of semiconductor device increases, a density of the cantilever structure is also increased. In order to test various semiconductor devices, bumps having various heights are required. However, a bump having a high aspect ratio is very difficult to manufacture.

SUMMARY OF THE INVENTION

It is an object of the present invention to provide a method for forming a bump of a probe card wherein a bump having a high aspect ratio for supporting a probe tip and a probe beam is formed using a semiconductor substrate as a mold without using a photoresist film.

In order to achieve above-described object of the present invention, there is provided a method for forming a bump of a probe card, the method comprising steps of: (a) forming a protective film pattern defining a bump region on a first surface of a semiconductor substrate; (b) forming a metal film on a second surface of the semiconductor substrate; (c) etching the semiconductor substrate exposed by the protective film pattern and the metal film thereunder to form the bump region; (d) removing the protective film pattern and the metal film; (e) forming an insulation layer on the semiconductor substrate including the bump region; (f) bonding the semiconductor substrate to a ceramic substrate; and (g) forming a bump filling up the bump region.

Preferably, the step (a) comprises: forming a protective film on the semiconductor substrate; forming a photoresist film pattern defining the bump region on the protective film; etching the protective film exposed by the photoresist film pattern to form the protective film pattern; and removing the photoresist film pattern.

Preferably, the protective film pattern comprises one of a thermal oxide film, a CVD oxide film and a TEOS film.

Preferably, the metal film comprises an Al film.

Preferably, the insulation film comprises one of an oxide film and a nitride film.

The method in accordance with the present invention may further comprise forming a bonding layer at an interface of the semiconductor substrate and the ceramic substrate.

Preferably, the bonding layer comprises one of a photoresist film and an epoxy layer.

Preferably, the step (g) comprises plating a nickel.

The method in accordance with the present invention may further comprise bonding a glass layer to each of the first surface and the second surface of the semiconductor substrate.

Preferably, the step (g) comprises: (g-1) forming a seed layer on the first surface of the semiconductor substrate and the bump region; (g-2) forming a second DFR on the second surface of the semiconductor substrate; (g-3) forming a first metal layer in the bump region; (g-4) polishing the first surface of the semiconductor substrate via a CMP process until the glass layer is exposed; (g-5) removing the second DFR; (g-6) forming a first DFR on the first surface of the semiconductor substrate; (g-7) forming a third DFR exposing the bump region on the second surface of the semiconductor substrate; and (g-8) forming a second metal layer in the bump region.

The method in accordance with the present invention may further comprise forming a bonding layer on a surface of the ceramic substrate corresponding to the bump prior to carrying out the step (f).

Preferably, the bonding layer comprises one of a Sn layer, an AgSn layer and an AuSn layer.

Preferably, each of the first metal layer and the second metal layer comprises a nickel layer.

The method in accordance with the present invention may further comprise attaching a cantilever beam to a top portion of the bump.

DETAILED DESCRIPTION OF THE INVENTION

The present invention will now be described in detail with reference to the accompanied drawings. The interpretations of the terms and wordings used in Description and Claims should not be limited to common or literal meanings. The embodiments of the present invention are provided to describe the present invention more thoroughly for those skilled in the art.

FIGS. 1a through 1j are cross-sectional views illustrating a method for forming a bump of a probe card in accordance with a first embodiment of the present invention.

Figure 1A:
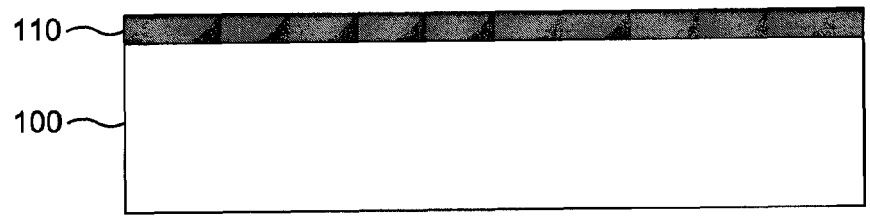
FIGS. 1a through 1j are cross-sectional views illustrating a method for forming a bump of a probe card in accordance with a first embodiment of the present invention.

Referring to FIG. 1a, a protective film 110 is formed on a first surface of a semiconductor substrate 100. Preferably, the protective film 110 includes a thermal oxide film, a CVD oxide film or a TEOS film.

Figure 1B:
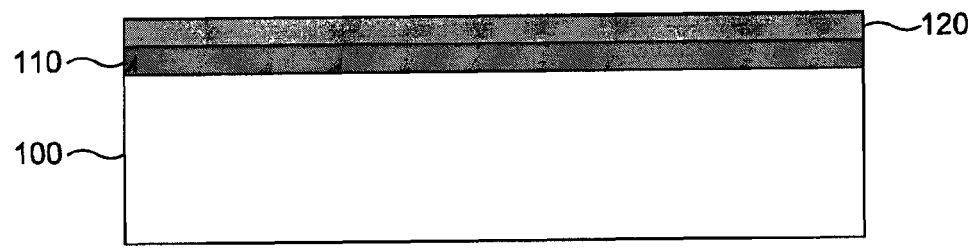
Figure 1C:

Referring to FIGS. 1b and 1c, a photoresist film 120 is formed on the protective film 110. Thereafter, a photoresist film pattern 120a is formed via a lithography process using a mask defining a bump region 140 (shown in FIG. 1g) where a bump 180 (shown in FIG. 1j) is to be formed.

Figure 1D:
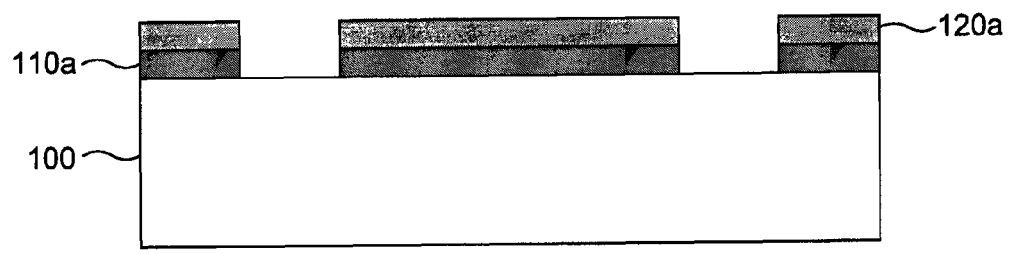

Referring to FIG. 1d, the protective film 110 exposed by the photoresist film pattern 120a to form the protective film pattern 110a exposing the bump region 140.

Figure 1E:
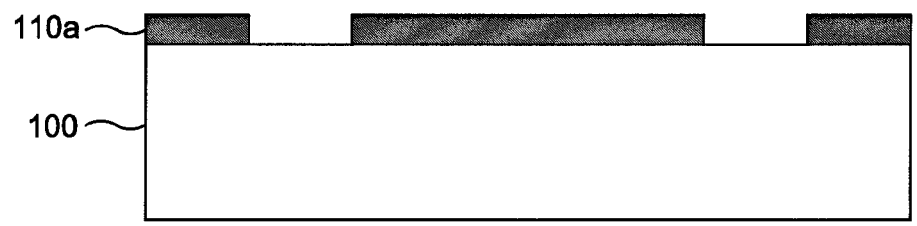

Referring to FIG. 1e, a remaining portion of the photoresist film pattern 120a is removed.

Figure 1F:

Referring to FIG. 1f, a metal film 130 is formed on a second surface of the semiconductor substrate 100. Preferably, the metal film 130 comprises an Al film.

Figure 1G:
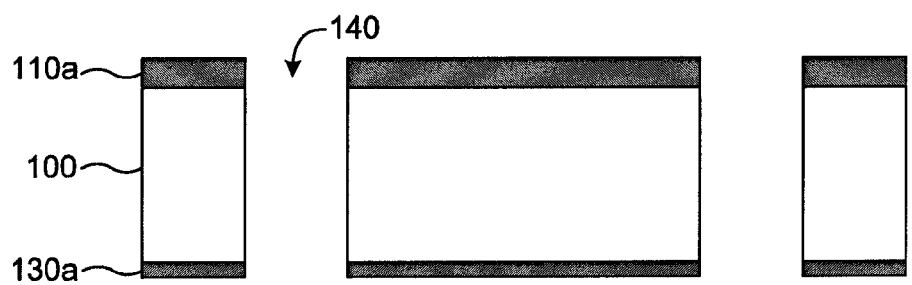

Referring to FIG. 1g, the semiconductor substrate 100 exposed by the protective film pattern 110a and the metal film 130 thereunder are etched to form the bump region 140. The exposed portion of the semiconductor substrate 100 and the metal film 130 thereunder are completely etched to form a through-hole.

Figure 1H:
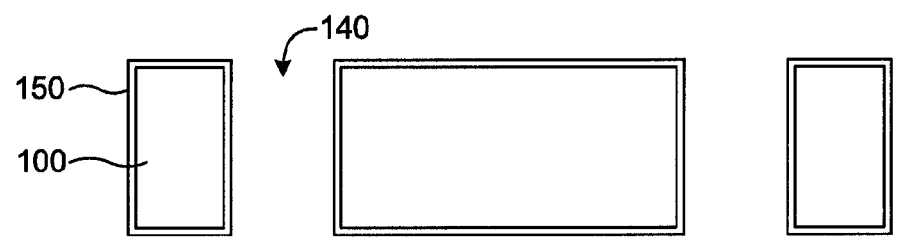

Referring to FIG. 1h, the protective film pattern 110a and the metal film 130 are removed. Thereafter, an insulation film 150 is formed on an entire surface of the semiconductor substrate 100 including the bump region 140. Preferably, the insulation film 150 comprises an oxide film or a nitride film.

Figure 1I:
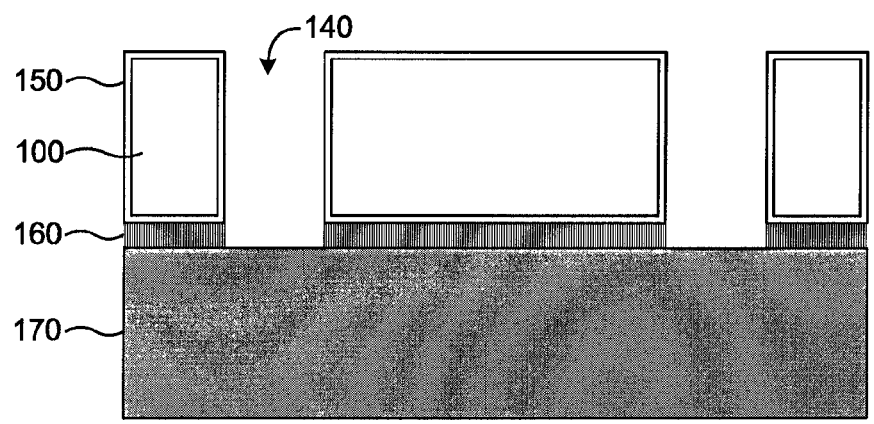

Referring to FIG. 1i, the semiconductor substrate 100 is bonded to a ceramic substrate 170. The ceramic substrate 170 may be a space transformer of the probe card (not shown). It is preferable that a bonding layer 160 is formed at an interface of the semiconductor substrate 100 and the ceramic substrate 170. The bonding layer 160 may be a photoresist film or an epoxy layer.

Figure 1J:
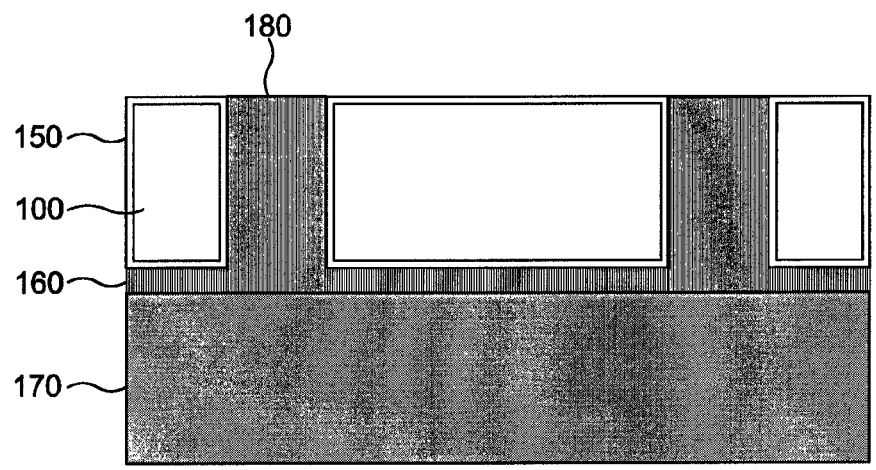

Referring to FIG. 1j, the bump region 140 is filled up to form a bump 180. Preferably, the bump 180 is formed via plating a nickel.

Although not shown, a cantilever beam may be attached to top portion of the bump 180.

Figure 2A:
FIGS. 2a through 2n are cross-sectional views illustrating a method for forming a bump of a probe card in accordance with a second embodiment of the present invention.
Figure 2B:
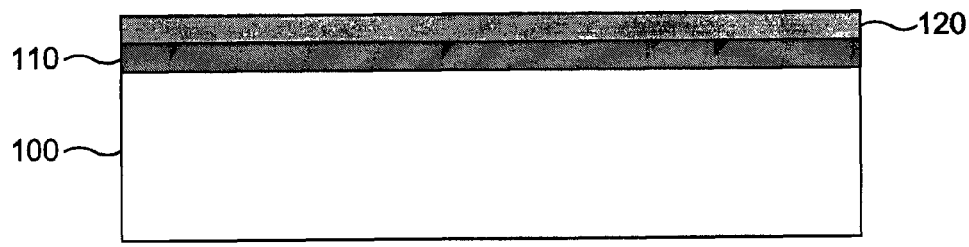
Figure 2C:
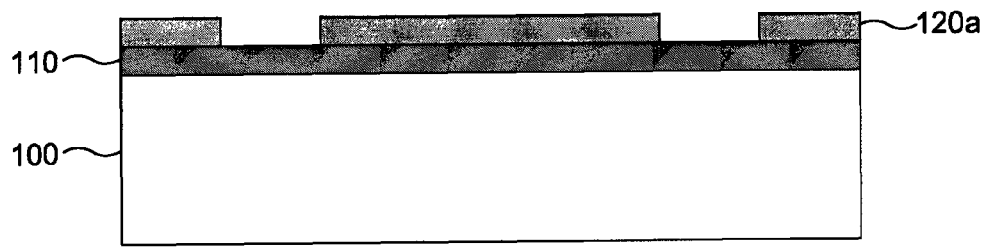
Figure 2D:
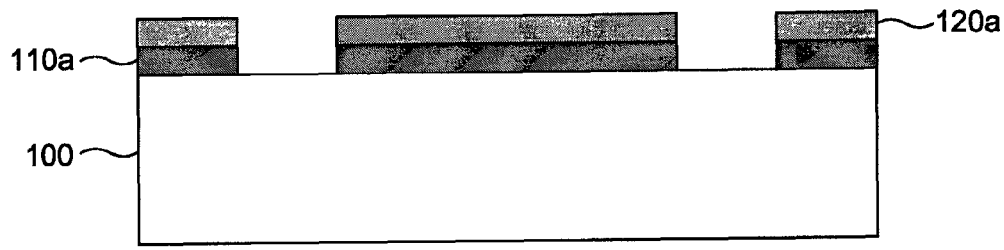
Figure 2E:
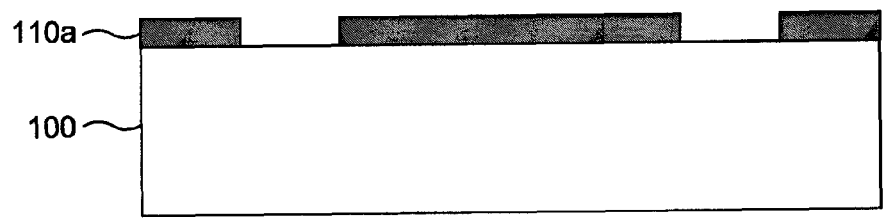
Figure 2F:
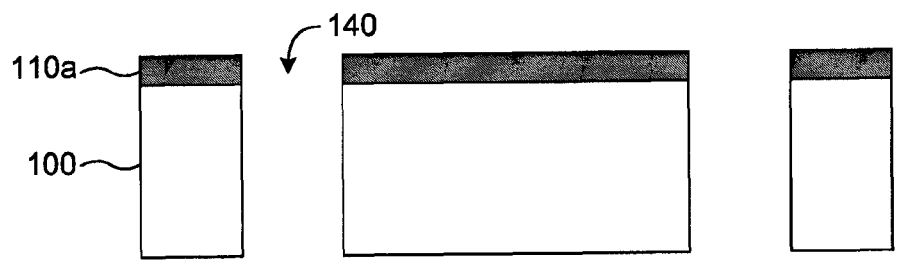
Figure 2G:
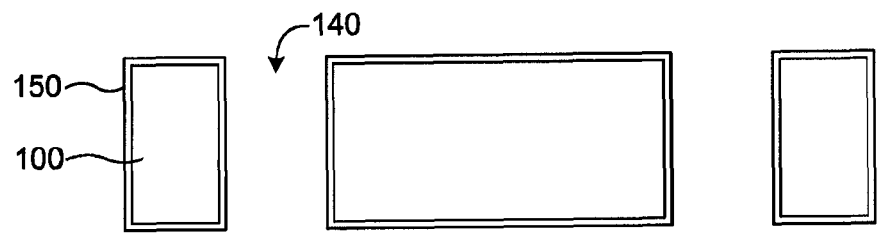
Figure 2H:
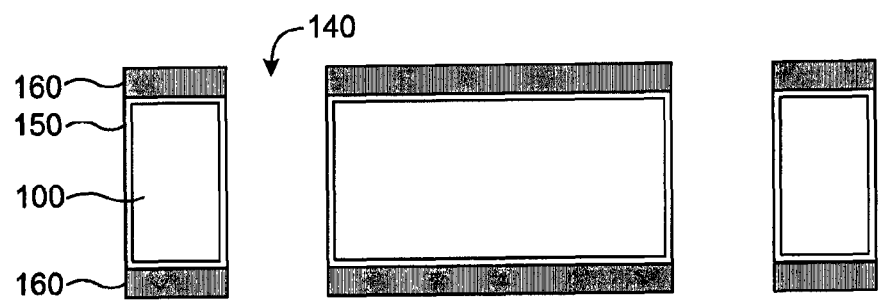
Figure 2I:
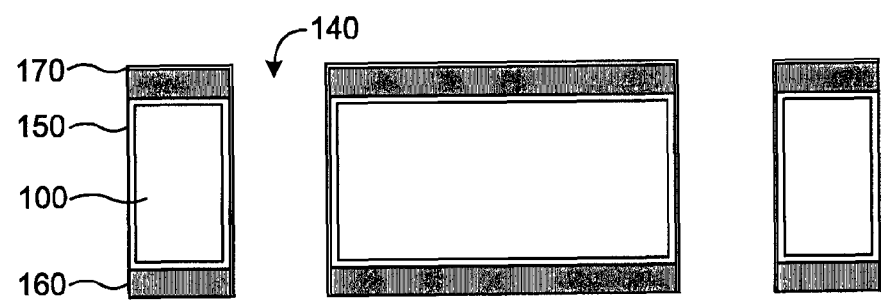
Figure 2J:
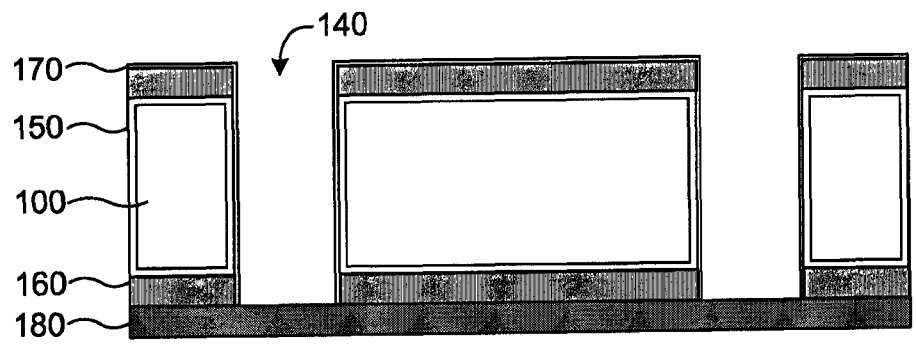
Figure 2K:
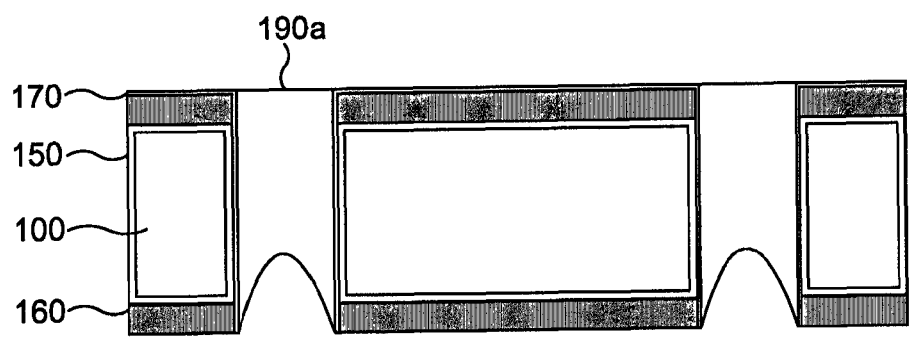
Figure 2L:
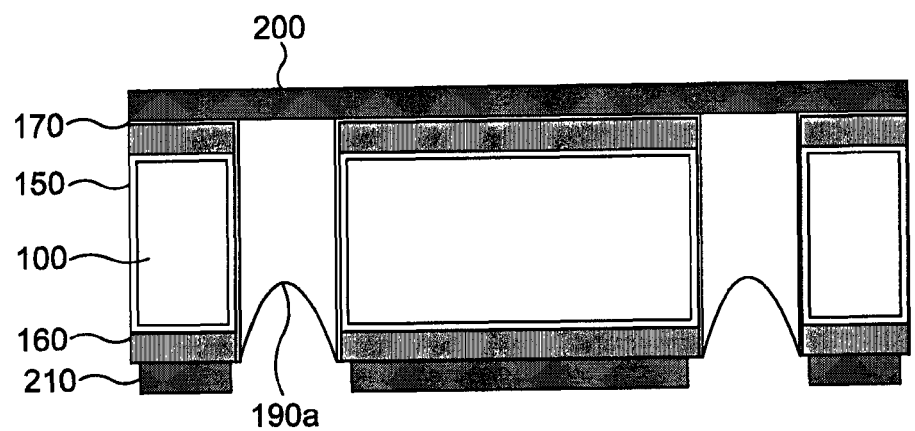
Figure 2M:
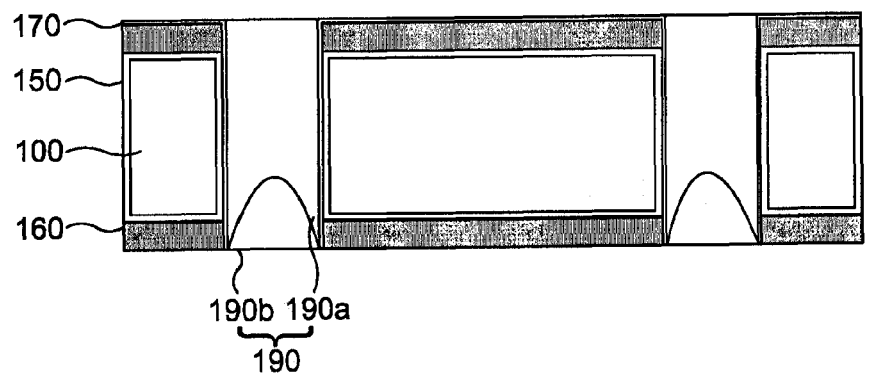
Figure 2N:
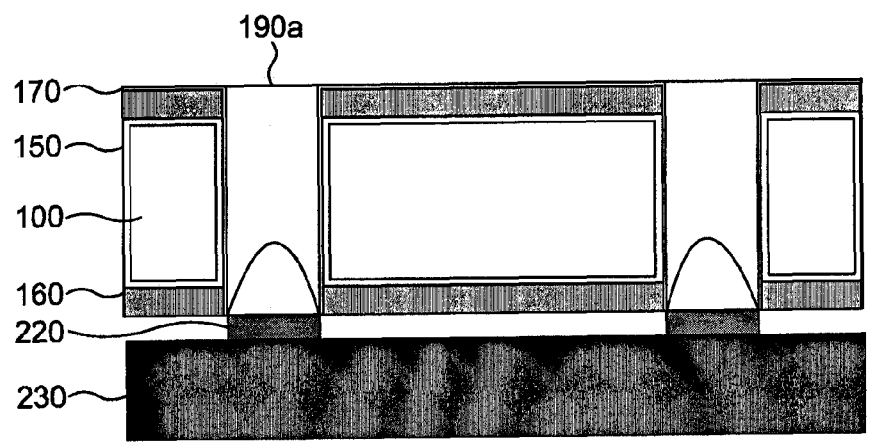

FIGS. 2a through 2n are cross-sectional views illustrating a method for forming a bump of a probe card in accordance with a second embodiment of the present invention.

Referring to FIG. 2a, a protective film 110 is formed on a first surface of a semiconductor substrate 100. Preferably, the protective film 110 includes a thermal oxide film, a CVD oxide film or a TEOS film.

Referring to FIGS. 2b and 2c, a photoresist film 120 is formed on the protective film 110. Thereafter, a photoresist film pattern 120a is formed via a lithography process using a mask defining a bump region 140 (shown in FIG. 2f) where a bump 190 (shown in FIG. 2m) is to be formed.

Referring to FIG. 2d, the protective film 110 exposed by the photoresist film pattern 120a to form the protective film pattern 110a exposing the bump region 140.

Referring to FIG. 2e, a remaining portion of the photoresist film pattern 120a is removed.

Referring to FIG. 2f, the semiconductor substrate 100 exposed by the protective film pattern 110a is etched to form the bump region 140. The exposed portion of the semiconductor substrate 100 is completely etched to form a through-hole.

Referring to FIG. 2g, an insulation film 150 is formed on an entire surface of the semiconductor substrate 100 including the bump region 140. Preferably, the insulation film 150 comprises an oxide film or a nitride film.

Referring to FIG. 2h, a glass layer 160 is bonded to each of the first surface and the second surface of the semiconductor substrate 100. Preferably, the bonding process comprises an anode bonding process.

Referring to FIG. 2i, a seed layer 170 is formed on a portion of the glass layer 160 on the first surface of the semiconductor substrate 100 and an inner surface of the bump region 140.

Referring to FIG. 2j, a second DFR (Dry Film Resist) 180 is formed on the second surface of the semiconductor substrate 100.

Referring to FIG. 2k, a first metal layer 190a is formed in the bump region 140. Preferably, the first metal layer 190a comprises a nickel layer.

Thereafter, the first surface of the semiconductor substrate 100 is polished via a CMP process until the glass layer 160 is exposed. When the semiconductor substrate 100 is thick, the bump region 140 may not be completely filled up as shown in FIG. 2k. Thereafter, the second DFR 180 is removed.

Referring to FIG. 2l, a first DFR 200 is formed on the first surface of the semiconductor substrate 100 and a third DFR 210 exposing the bump region 140 is formed on the second surface of the semiconductor substrate 100.

Referring to FIG. 2m, a second metal layer 190b is formed in the bump region 140. Similar to the formation process of the first metal layer 190a, the second metal layer 190b may be formed by carrying out the nickel plating process to form a nickel layer and then planarizing the nickel layer via a CMP process.

Referring to FIG. 2n, a bonding layer 220 is formed on a surface of the ceramic substrate 170 corresponding to the bump 190. Preferably, the bonding layer 220 comprises a Sn layer, an AgSn layer or an AuSn layer. Thereafter, a remaining portion of the first DFR 200 is removed.

Thereafter, the semiconductor substrate 100 is bonded to a ceramic substrate 230. The ceramic substrate 230 may be a space transformer of the probe card (not shown).

Although not shown, a cantilever beam may be attached to top portion of the bump 190.

As described above, the method for forming the bump of the probe card in accordance with the present invention is advantageous in that the bump having a high aspect ratio for supporting a probe tip and a probe beam is formed using the semiconductor substrate as a mold without using the photoresist film.

What is claimed is:

1. A method for forming a bump of a probe card, the method comprising steps of:
    (a) forming a protective film pattern defining a bump region on a first surface of a semiconductor substrate;
    (b) etching the bump region of the semiconductor substrate to form a through-hole in the semiconductor substrate, said through-hole corresponding to the bump region;
    (c) removing the protective film pattern;
    (d) forming an insulation layer on the entire surface of the semiconductor substrate and the entire surface of the through hole;
    (e) bonding the semiconductor substrate to a ceramic substrate; and
    (f) forming a bump filling up the through-hole.

2. The method in accordance with claim 1, wherein the step (a) comprises:
    forming a protective film on the semiconductor substrate;
    forming a photoresist film pattern defining the bump region on the protective film;
    etching the protective film exposed by the photoresist film pattern to form the protective film pattern; and
    removing the photoresist film pattern.

3. The method in accordance with claim 1, wherein the protective film pattern comprises one of a thermal oxide film, a CVD oxide film and a TEOS film.

4. The method in accordance with claim 1, wherein the insulation layer comprises one of an oxide film and a nitride film.

5. The method in accordance with claim 1, further comprising forming a bonding layer at an interface of the semiconductor substrate and the ceramic substrate.

6. The method in accordance with claim 5, wherein the bonding layer comprises one of a photoresist film and an epoxy layer.

7. The method in accordance with claim 1, wherein the step (f) comprises plating a nickel.

8. The method in accordance with claim 1, further comprising bonding a glass layer to each of the first surface and a second surface of the semiconductor substrate, said second surface being opposite to the first surface.

9. The method in accordance with claim 8, wherein the step (f) comprises:
  (f-1) forming a seed layer on the first surface of the semiconductor substrate and the bump region;
  (f-2) forming a second DFR on the second surface of the semiconductor substrate;
  (f-3) forming a first metal layer in the bump region;
  (f-4) polishing the first surface of the semiconductor substrate via a CMP process until the glass layer is exposed;
  (f-5) removing the second DFR;
  (f-6) forming a first DFR on the first surface of the semiconductor substrate;
  (f-7) forming a third DFR exposing the bump region on the second surface of the semiconductor substrate; and
  (f-8) forming a second metal layer in the bump region.

10. The method in accordance with claim 8, further comprising forming a bonding layer on a surface of the ceramic substrate corresponding to the bump prior to carrying out the step (e).

11. The method in accordance with claim 10, wherein the bonding layer comprises one of a Sn layer, an AgSn layer and an AuSn layer.

12. The method in accordance with claim 8, wherein each of the first metal layer and the second metal layer comprises a nickel layer.

13. The method in accordance with claim 1, further comprising attaching a cantilever beam to a top portion of the bump.

* * * * *